(12) United States Patent
Panavalappil Kumarankutty et al.

(10) Patent No.: US 12,322,633 B2
(45) Date of Patent: Jun. 3, 2025

(54) ELECTROSTATIC CHUCK WITH IMPROVED TEMPERATURE CONTROL

(71) Applicant: Applied Materials, Inc., Santa Clara, CA (US)

(72) Inventors: Hanish Kumar Panavalappil Kumarankutty, Bengaluru (IN); Sean M. Seutter, San Jose, CA (US); Sudhir R. Gondhalekar, Pleasanton, CA (US); Wendell Glenn Boyd, Jr., Morgan Hill, CA (US); Badri Ramamurthi, Los Gatos, CA (US); Shekhar Athani, Bangalore (IN); Anil Kumar Kalal, Bangalore (IN); Jay Dee Pinson, II, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 833 days.

(21) Appl. No.: 17/368,134

(22) Filed: Jul. 6, 2021

(65) Prior Publication Data
US 2022/0005723 A1     Jan. 6, 2022

Related U.S. Application Data

(60) Provisional application No. 63/048,648, filed on Jul. 6, 2020.

(51) Int. Cl.
*H01L 21/683*     (2006.01)
*H01J 37/32*      (2006.01)
(Continued)

(52) U.S. Cl.
CPC .... *H01L 21/6833* (2013.01); *H01J 37/32724* (2013.01); *H01L 21/67248* (2013.01); *H01L 21/6875* (2013.01); *H01J 2237/2007* (2013.01)

(58) Field of Classification Search
CPC .......... H01L 21/6833; H01L 21/67248; H01L 21/6875; H01J 37/32724; H01J 2237/2007
See application file for complete search history.

(56) References Cited

U.S. PATENT DOCUMENTS 5,761,023 A    6/1998  Lue et al.
6,077,357 A *  6/2000  Rossman ............ H01L 21/6833
                                                    118/728

(Continued)

FOREIGN PATENT DOCUMENTS

JP    H1041378 A    2/1998
JP    2006013256 A  1/2006
(Continued)

OTHER PUBLICATIONS

PCT International Search Report and Written Opinion in PCT/US2021/040476 dated Nov. 2, 2021, 10 pages.
Translation of JP2013153171, 31 pages.

*Primary Examiner* — Eric A. Gates
*Assistant Examiner* — Eric Daniel Whitmire
(74) *Attorney, Agent, or Firm* — Servilla Whitney LLC (57) ABSTRACT

Embodiments of the disclosure provide electrostatic chucks for securing substrates during processing. Some embodiments of this disclosure provide methods and apparatus for increased temperature control across the radial profile of the substrate. Some embodiments of the disclosure provide methods and apparatus for providing control of hydrogen concentration in processed films during a high-density plasma (HDP) process.

15 Claims, 3 Drawing Sheets

(51) Int. Cl.
    *H01L 21/67*     (2006.01)
    *H01L 21/687*     (2006.01)

(56) References Cited

U.S. PATENT DOCUMENTS

| | | | |
|---|---|---|---|
| 2006/0090855 A1* | 5/2006 | Kimura | H01L 21/67109 |
| | | | 118/724 |
| 2006/0285270 A1 | 12/2006 | Lee | |
| 2015/0348813 A1 | 12/2015 | Mangalore et al. | |
| 2018/0374724 A1 | 12/2018 | Parkhe et al. | |
| 2019/0013231 A1 | 1/2019 | Yamaguchi et al. | |
| 2019/0259646 A1 | 8/2019 | Akabane | |
| 2020/0126773 A1* | 4/2020 | Unno | H01L 21/683 |

FOREIGN PATENT DOCUMENTS

| | | | |
|---|---|---|---|
| JP | 2006156938 A | 6/2006 |
| JP | 2013153171 A | 8/2013 |
| JP | 2020068350 A | 4/2020 |
| KR | 100303076 B1 | 11/2001 |
| KR | 20120137986 A | 12/2012 |
| KR | 20150082271 A | 7/2015 |
| TW | 200404646 A | 4/2004 |
| TW | 201947702 A | 12/2019 |

\* cited by examiner

ELECTROSTATIC CHUCK WITH IMPROVED TEMPERATURE CONTROL

CROSS-REFERENCE TO RELATED APPLICATIONS

This application claims priority to U.S. Provisional Application No. 63/048,648, filed Jul. 6, 2020, the entire disclosure of which is hereby incorporated by reference herein.

TECHNICAL FIELD

Embodiments of the disclosure generally relate to an apparatus for securing substrates during processing. In particular, embodiments of this disclosure relate to apparatus and methods for securing substrates during a high-density plasma (HDP) process.

BACKGROUND

Negative-bias temperature instability (NBTI) is a key reliability issue in metal-oxide-semiconductor field-effect transistors (MOSFETs). NBTI manifests as an increase in the threshold voltage and consequent decrease in drain current and transconductance of a MOSFET. In general, a more stable dynamic random access memory (DRAM) refresh rate and NBTI performance are preferred for providing improved device yield.

Gate-Induced drain leakage (GIDL) is a leakage current that occurs due to the high electric field between Gate and Drain. GIDL happens when the MOSFET is biased in the accumulation region and when the drain bias is much lower than the breakdown voltage.

Gate-induced drain leakage is an undesirable short-channel effect that occurs at higher drain biases in an overdriven off state of a transistor. The GIDL is the result of a deep depletion region that forms in the drain at high off biases (negative for NFET, positive for PFET). The depletion region causes band bending which in turn allows conductive band-to-band tunneling that creates excess current. GIDL can be detrimental to integrated circuits, specifically non-volatile memory circuits such as flash EEPROMs.

Higher temperatures at the edge of the substrate during the formation processes for MOSFETs lead to a lower concentrations of hydrogen (H %) in the processed layers of the substrate. Conversely, a lower temperature provides higher H % and a higher wet etch rate (WER) for the processed films.

The tunability or control of the substrate temperature, particularly at the edge, is limited by the design of the electrostatic chuck (ESC) as well. Current designs limit the maximum gas pressure edge cooling channels between wafer and ESC before gas leakage is problematic. This design capacity limits the available parameters between the inner channel and the outer channel for tuning temperature and H % at the wafer's edge.

Accordingly there is a need in the art for apparatus which allow for increased tunability of temperature and H % of films processed by a HDP at the edge of the wafer.

SUMMARY

One or more embodiments of the disclosure are directed to an electrostatic chuck comprising a top surface, a bottom surface and a controller. The top surface comprises a central region comprising a plurality of substrate support mesas, an inner channel (IC) with an IC width surrounding the central region, an inner band (IB) with an IB width surrounding the inner channel, an outer channel (OC) with an OC width surrounding the inner band, and an outer band (OB) with an OB width surrounding the outer channel. The controller is configured to control temperature across a wafer secured to the top surface of the electrostatic chuck during processing.

Additional embodiments of the disclosure are directed to an electrostatic chuck comprising a top surface and a bottom surface. The top surface comprises a central region comprising a plurality of substrate support mesas, an inner channel (IC) with an IC width surrounding the central region, an inner band (IB) with an IB width surrounding the inner channel, an outer channel (OC) with an OC width surrounding the inner band, and an outer band (OB) with an OB width surrounding the outer channel. The electrostatic chuck is configured to provide a H % with a range divided by 2 (R/2) of less than or equal to about 2% across a wafer during processing.

Further embodiments of the disclosure are directed to a method of modifying an electrostatic chuck to improve control of temperature across a wafer surface secured to a top surface of the electrostatic chuck. The method comprises one or more of: reducing surface roughness of the top surface of the electrostatic chuck; changing the shape of a plurality of substrate support mesas; decreasing a contact area for a plurality of substrate support mesas; increasing a width of an inner band of the electrostatic chuck; increasing a width of an outer band of the electrostatic chuck; increasing a pressure within an outer channel; and decreasing a pressure within an inner channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, silicon nitride, strained silicon, silicon on insulator (SOI), carbon doped silicon oxides, amorphous silicon, doped silicon, germanium, aluminum gallium arsenide, aluminum gallium nitride, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure are directed to an electrostatic chuck. Some embodiments of the disclosure advantageously provide an electrostatic chuck configured to tune the concentration of hydrogen (H %) across the surface of a wafer secured to the electrostatic chuck. Some embodiments of the disclosure advantageously provide an electrostatic chuck with a range of variability in H % (range divided by 2; R/2) of less than or equal to about 2%.

Many variability plots provide the average value of a measurement across a wafer, as well as the standard variation and the range of values present on the wafer. The range of variability may be expressed as the average value+/−a range. As the range of variability extends both above and below the average value the range of variability is sometimes expressed simply as R/2, or the variability in only one direction from the average value.

Figure 1:
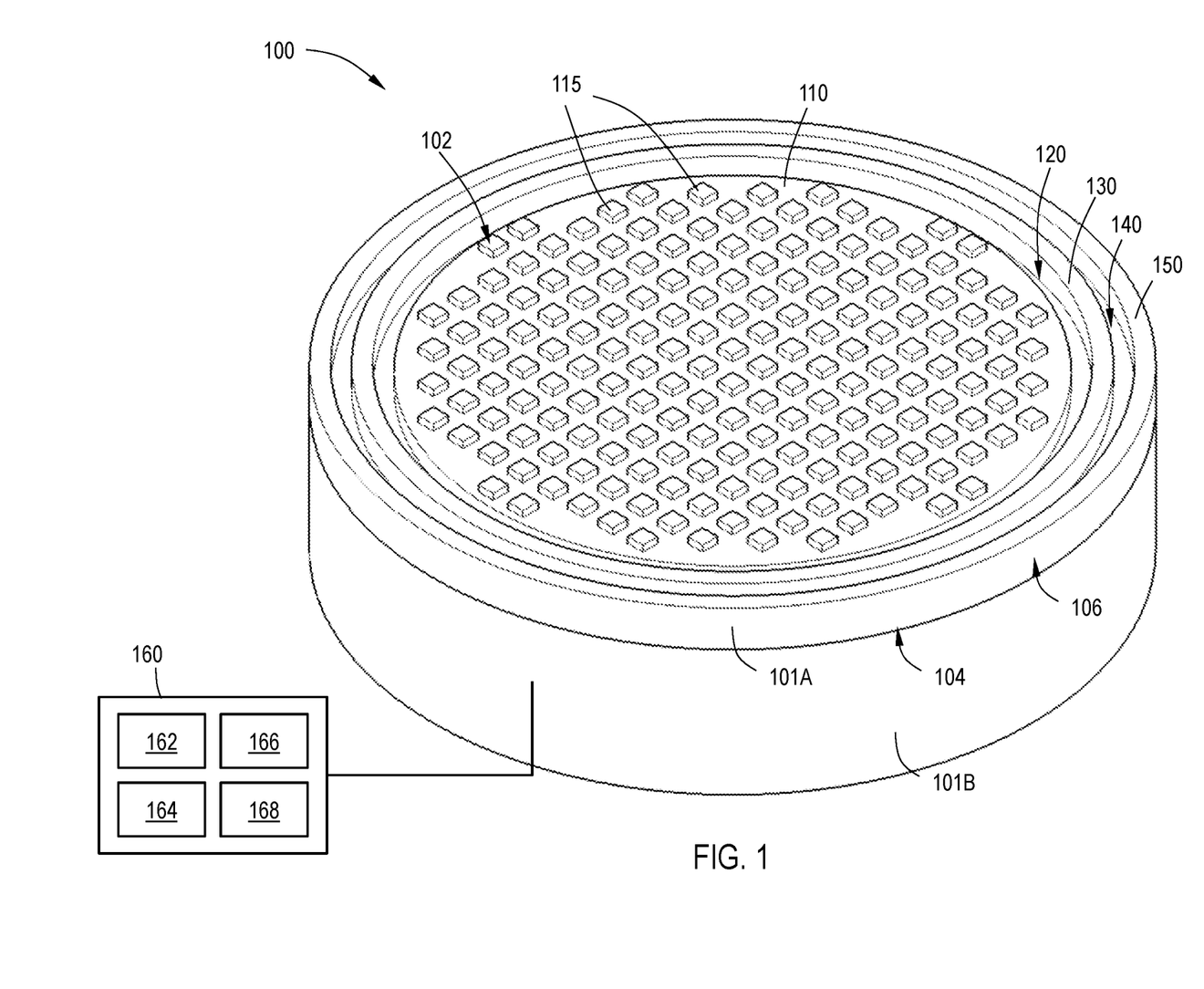
FIG. 1 illustrates a parallel projection view of an electrostatic chuck according to one or more embodiment of the disclosure.
Figure 2:
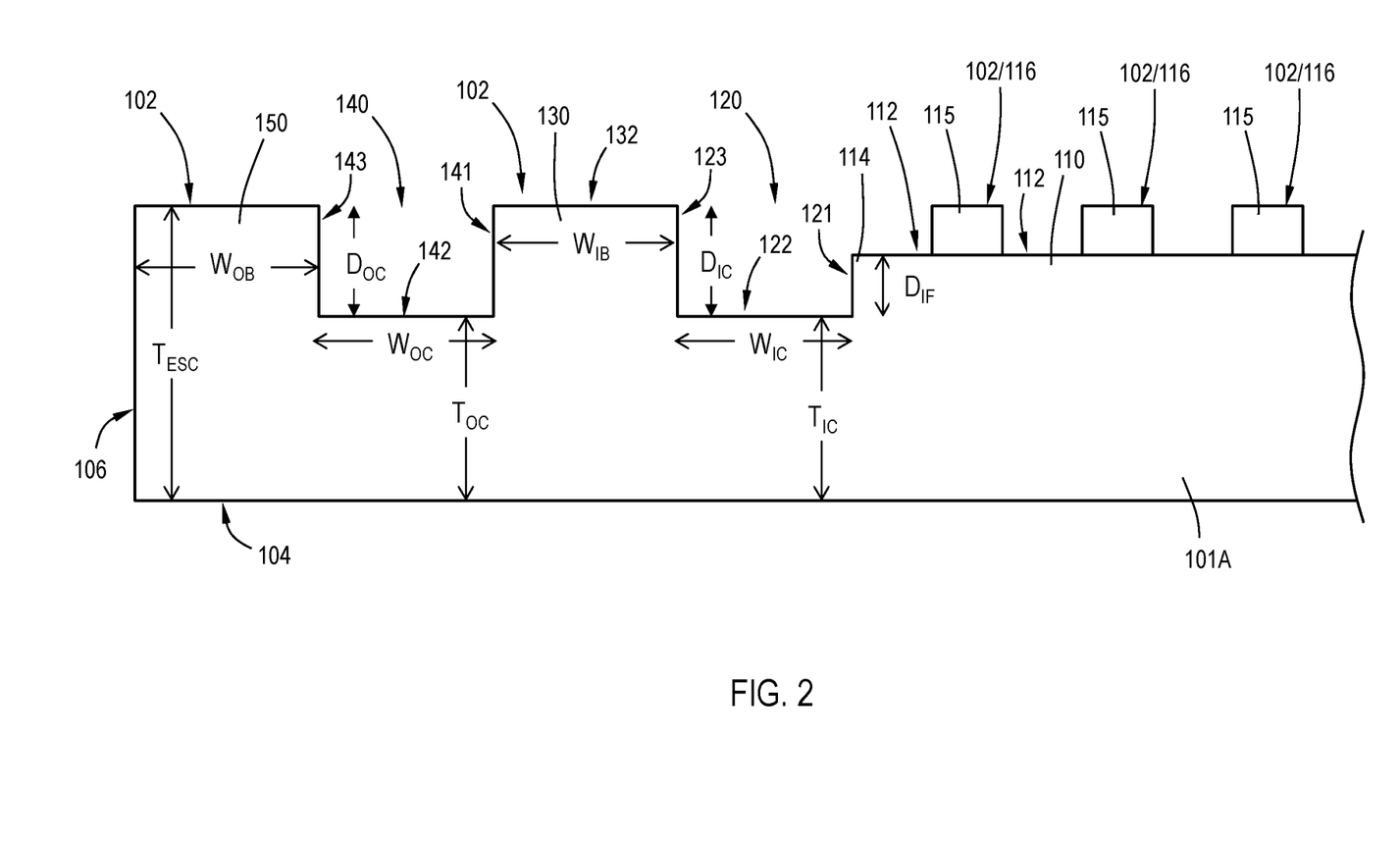
FIG. 2 illustrates a partial cross-sectional view of the outer peripheral edge of an electrostatic chuck according to one or more embodiment of the disclosure.

Referring to FIGS. 1 and 2, one or more embodiment of the disclosure is directed to an electrostatic chuck 100. FIG. 1 illustrates a parallel projection view of an electrostatic chuck 100 according to one or more embodiment. FIG. 2 illustrates a partial cross-sectional view of an electrostatic chuck 100 according to one or more embodiment. The electrostatic chuck 100 illustrated is a generally disk-shaped body 101 comprising an upper coating layer 101A and a lower body 101B. The upper coating layer 101A has a top surface 102 and a bottom surface 104 defining a thickness $T_{ESC}$ of the upper coating layer 101A. The upper coating layer 101A is in contact with the lower body 101B such that the top surface of the lower body abuts the bottom surface 104 of the upper coating layer 101A. The lower body 101B has a bottom surface 105. The thickness of the body 101, including the upper coating layer 101A and the lower body 101B, is in a range of about 1.5 inches to about 2.5 inches. In some embodiments, the thickness of the body 101 is about 2 inches.

In some embodiments, the thickness $T_{ESC}$ of the upper coating layer 101A is in a range of about 7 mils to about 15 mils, or about 8 mils to about 12 mils. In some embodiments, the thickness $T_{ESC}$ of the upper coating layer 101A is about 10 mils.

An outer peripheral edge 106 forms the outer boundary of the body 101. The top surface 102 is configured to support a substrate during processing.

The top surface 102 of the electrostatic chuck 100 comprises a central region 110, an inner channel 120, an inner band 130, an outer channel 140 and an outer band 150. The central region 110, also referred to as the field of the electrostatic chuck 100, is bounded on its outer peripheral edge by the inner channel 120. The intersection 114 of the inside wall 121 of the inner channel 120 with the top surface 112 is the outer peripheral edge of the central region 110.

The diameter of the central region 110 relative to the overall diameter of the upper coating layer 101A can be varied. The diameter of the central region 110 is measured from the intersection 114 of the inside wall 121 of the inner channel 120 with the top surface 112 of the central region 110 through the center of the body 101. In some embodiments, the ratio of the diameter of the central region 110 to the diameter of the body 101 is in the range of 80% to 95%, or in the range of 85% to 95%, or in the range of 85% to 92% or the range of 86% to 90%.

The inner channel 120 bounding the central region 110 has a width $W_{IC}$ and extends a depth $D_{IC}$ into the upper coating layer 101A of the electrostatic chuck 100. The width $W_{IC}$ is measured as the distance between the inside wall 121 and the outside wall 123 of the inner channel 120. The depth $D_{IC}$ is measured from the top surface 102 of the upper coating layer 101A to the bottom surface 122 of the inner channel 120. The thickness $T_{IC}$ of the upper coating layer 101A at the inner channel 120 is measured from the bottom surface 122 of the inner channel 120 to the bottom surface 104 of the upper coating layer 101A. In the embodiment illustrated in FIG. 2, the depth of the inner channel 120 adjacent the inside wall 121 is less than the depth $D_{IC}$ of the inner channel. The depth $D_{IF}$ adjacent the field of the central region 110 is smaller in this embodiment due to the top surface 112 being lower than the support surface that is the top surface 102.

The width $W_{IC}$ of the inner channel 120, according to some embodiments, is in the range of 0.5 mm to 5 mm, or in the range of 1 mm to 5 mm, or in the range of 1.5 mm to 5 mm, or in the range of 2 mm to 5 mm, or in the range of 2 mm to 4.5 mm.

The depth $D_{IC}$ of the inner channel 120, according to one or more embodiments, is less than or equal to 1 mm, 0.75 mm, 0.5 mm, 0.3 mm or 0.2 mm. In some embodiments, the depth $D_{IC}$ of the inner channel 120 is in the range of 10% to 90%, 20% to 80%, 30% to 70% or 40% to 60% of the thickness $T_{ESC}$ of the upper coating layer 101A.

The inner channel 120 is separated from the outer channel 140 by an inner band 130. The inner band 130 has a top surface 132 that is substantially coplanar with the top surface 102 of the upper coating layer 101A. As used in this manner, the term "substantially coplanar" means that the major plane formed by the top surface 102 of the upper coating layer 101A is within ±0.025 mm of the major plane formed by the top surface 132 of the inner band 130.

The width $W_{IB}$ of the inner band 130 can be varied to change the spacing between the inner channel 120 and the outer channel 140. A standard electrostatic chuck may have an IB width of about 2 mm to about 3 mm, more specifically, about 2.3 mm to about 2.7 mm. In some embodiments, the width of the inner band $W_{IB}$ (IB width) is increased by a percentage in a range of about 50% to about 60%, in a range of about 90% to about 110%, or in a range of about 50% to about 110%. In some embodiments, the IB width is increased by an amount in a range of about 1.2 mm to about 1.6 mm, in a range of about 2.0 mm to about 3.0 mm, or in a range of about 1.2 mm to about 3.0 mm.

The outer channel 140 bounding the inner band 130 has a width $W_{OC}$ and extends a depth $D_{OC}$ into the upper coating layer 101A of the electrostatic chuck 100. The width $W_{OC}$ is measured as the distance between the inside wall 141 and the outside wall 143 of the outer channel 140. The depth $D_{OC}$ is measured from the top surface 102 of the upper coating layer 101A to the bottom surface 142 of the outer channel 140. The thickness $T_{OC}$ of the upper coating layer 101A at the outer channel 140 is measured from the bottom surface 142 of the outer channel 140 to the bottom surface 104 of the upper coating layer 101A.

The width $W_{OC}$ of the outer channel 140, according to some embodiments, is in the range of 0.5 mm to 10 mm, or in the range of 1 mm to 8 mm, or in the range of 2 mm to 6 mm, or in the range of 2.5 mm to 5.5 mm.

The depth $D_{OC}$ of the outer channel 140, according to one or more embodiments, is less than or equal to 1 mm, 0.75 mm, 0.5 mm, 0.3 mm or 0.2 mm. In some embodiments, the depth $D_{OC}$ of the outer channel 140 is in the range of 10% to 90%, 20% to 80%, 30% to 70% or 40% to 60% of the thickness $T_{ESC}$ of the upper coating layer 101A.

The outer band 150 is the region of the electrostatic chuck 100 between the outside wall 143 of the outer channel 140 and the outer peripheral edge 106 of the body 101. In some embodiments, the width $W_{OB}$ of the outer band 150 in the range of 2 mm to 5.5 mm, in the range of 2.2 mm to 5.2 mm, in the range of 3.5 mm to 4 mm, in the range of 4 mm to 4.5 mm, in the range of 4.75 mm to 5.25 mm. A standard electrostatic chuck may have a width $W_{OB}$ of the outer band (OB width) of about 1.7 mm to about 2.7 mm, more specifically, about 2.0 mm to about 2.4 mm. In some embodiments, the OB width is increased by a percentage in a range of about 45% to about 55%, in a range of about 65% to about 70%, in a range of about 45% to about 70%, in a range of about 90% to about 110%, in a range of about 110% to about 150%, in a range of about 120% to about 140% or in a range of about 45% to about 150%. In some embodiments, the OB width is increased by an amount in a range of about 1.3 mm to about 1.7 mm, in a range of about 2.8 mm to about 3.1 mm, or in a range of about 1.3 mm to about 3.1 mm.

In the embodiment illustrated in FIGS. 1 and 2, the central region 110 comprises a plurality of substrate support mesas 115. The substrate support mesas 115 extend from the top surface 112 of the central region 110 to the top surface 116 of the substrate support mesas 115. In some embodiments, the top surfaces 116 of the plurality of substrate support mesas 115 are substantially coplanar with each other. In some embodiments, the top surfaces 116 of the substrate support mesas 115 are substantially coplanar with the top surface 102 of the upper coating layer 101A. The height of the substrate support mesas 115 depends on the height difference between the top surface 112 of the central region 110 and the top surface 102 of the upper coating layer 101A.

The substrate support mesas 115 may be any suitable shape. While rectangular mesas are shown in FIG. 1, the skilled artisan will recognize that this is merely for descriptive purposes and that the disclosure is not limited to rectangular or square mesas. in some embodiments, the substrate support mesas 115 have a shape selected from one or more of square, rectangular, round, ovoid, triangular, polygonal (e.g., pentagonal, hexagonal, etc), star, diamond, trapezoidal, cross, flower, semicircular or crescent.

Figure 3:
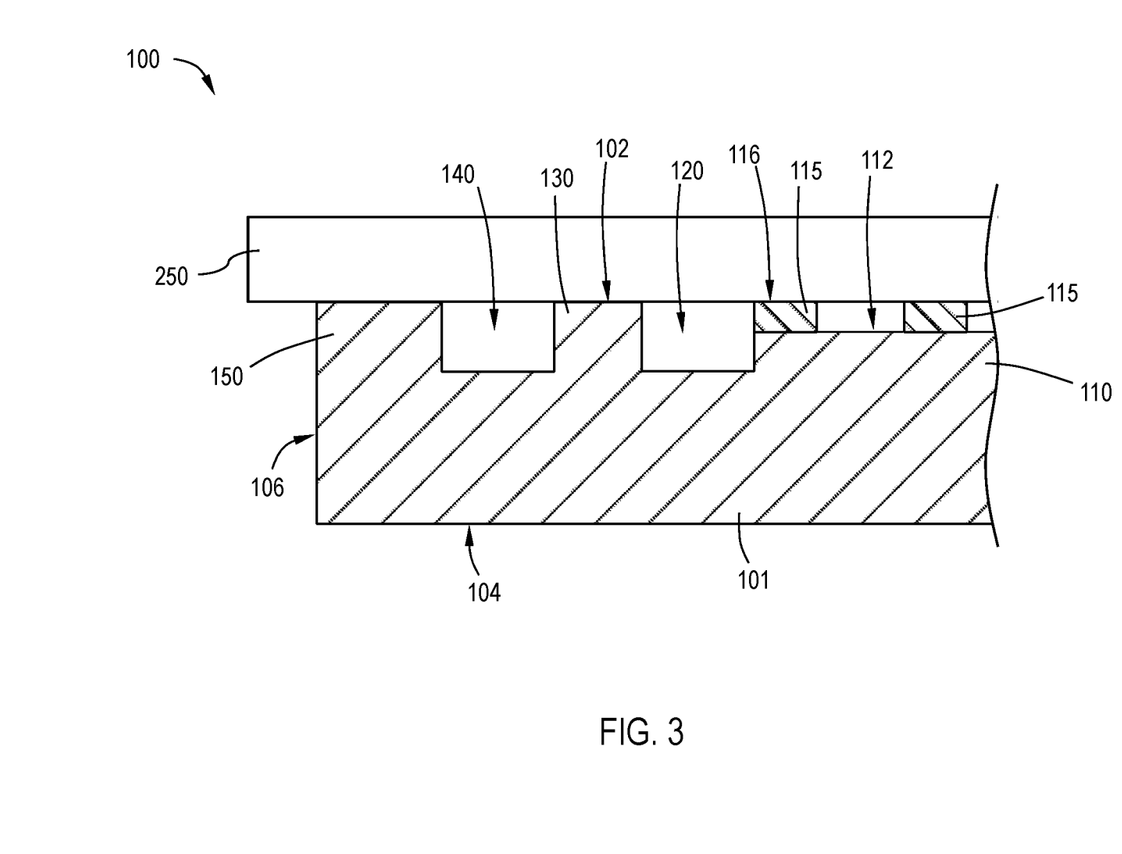
FIG. 3 illustrates a partial cross-sectional view of the outer peripheral edge of an electrostatic chuck according to one or more embodiment of the disclosure.

FIG. 3 illustrates a partial cross-sectional view of an electrostatic chuck 100 according to one or more embodiment of the disclosure. The electrostatic chuck 100 illustrated comprises a substrate 250 is shown on the top surface 102. In some embodiments, the substrate 250 is in contact with the substrate support mesas 115, the inner band 130 and the outer band 150. While the substrate support mesas 115 are shown with different shadings than the body 101 of the electrostatic chuck 100, the skilled artisan will recognize that that is merely for descriptive purposes. In some embodiments, the substrate support mesas 115 are made of the same material as the remainder of the electrostatic chuck 100. The shadings are provided to easily distinguish the contact areas.

The electrostatic chuck 100 further comprises a controller 160. In some embodiments, a controller 160 is coupled to the electrostatic chuck 100. In some embodiments, the controller 160 is coupled to one or more of the inner channel 120 or the outer channel 140. In some embodiments, there is more than one controller 160 connected to the individual channels and a primary control processor is coupled to each of the separate processors to control the electrostatic chuck 100.

The controller 160 may be one of any form of general-purpose computer processor, microcontroller, microprocessor, etc., that can be used in an industrial setting for controlling various channels and sub-processors.

The controller 160 can have a processor 162, a memory 164 coupled to the processor 162, input/output devices 166 coupled to the processor 162, and support circuits 168 to communication between the different electronic components. The memory 164 can include one or more of transitory memory (e.g., random access memory) and non-transitory memory (e.g., storage).

The memory 164, or computer-readable medium, of the processor 162 may be one or more of readily available memory such as random access memory (RAM), read-only memory (ROM), floppy disk, hard disk, or any other form of digital storage, local or remote. The memory 164 can retain an instruction set that is operable by the processor 162 to control parameters and components of the electrostatic chuck 100.

The support circuits 168 are coupled to the processor 162 for supporting the processor 162 in a conventional manner. Circuits may include, for example, cache, power supplies, clock circuits, input/output circuitry, subsystems, and the like.

Processes may generally be stored in the memory as a software routine that, when executed by the processor 162, causes the electrostatic chuck to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 160 has one or more configurations to execute individual processes or sub-processes to perform the method. The controller 160 can be connected to and configured to operate intermediate components to perform the functions of the methods. For example, the controller 160 can be connected to and configured to control one or more of gas valves, heaters, mass flow controllers, etc.

The controller 160 of some embodiments has one or more configurations selected from: a configuration to chuck and/or dechuck a substrate on the electrostatic chuck; a configuration to monitor the concentration of hydrogen across a wafer; a configuration to monitor surface temperature across a wafer; a configuration to control the pressure within the inner channel; or a configuration to control pressure within the outer channel.

As discussed previously, current electrostatic chuck designs limit the maximum gas pressure in an outer cooling channel before leakage is problematic. Accordingly, this disclosure identifies several methods for modifying a current electrostatic chuck to provide better control of temperature, and therefore hydrogen (H) concentration, across a wafer.

One or more embodiments of the disclosure advantageously provide electrostatic chucks with improved outer zone cooling. Some embodiments provide electrostatic chucks with improved cooling fluid leakage rates. Some embodiments provide ESCs with improved cooling at the ESC/wafer edge resulting in higher hydrogen percent radial tuning range, improved wet etch rates (WER) and/or minimize or eliminate gate induced drain leakage.

In some embodiments, the cooling fluid comprises one or more of helium, neon, argon, krypton or xenon. In some embodiments, the cooling fluid consists essentially of helium.

Current ESC designs are capable of having about 20 Torr pressure at each of the inner channel and outer channels. It was observed that a conventional ESC with 4 Torr and 10 Torr pressure at the inner channel and outer channel, respectively, results in hydrogen non-uniformity of about 8.7%. The inventors surprisingly found that an inner channel:outer channel pressure ratio of 6:14 Torr resulted in a hydrogen non-uniformity of 0.5%. Without being bound by any particular theory of operation, it is believed that the GIDL is eliminated or minimized by changing the inner and outer channel backside pressure. Some embodiments advantageously provide hydrogen percent non-uniformity less than about 5%, 4%, 3% or 2% for a process at 315° C. Some embodiments provide improved wafer cooling efficiency. Some embodiments enable higher outer channel setpoint, lower inner channel setpoint and higher outer:inner channel ratio for process tuning. Some embodiments lower the ESC/substrate helium leakage rate. Some embodiments provide improved substrate temperature control.

One embodiment of the disclosure provides for an electrostatic chuck with decreased surface roughness. Without being bound by theory, decreasing the surface roughness of the top surface of the electrostatic chuck provides for more efficient heat transfer between the substrate support mesas and the wafer. Further, decreasing the surface roughness of the top surface of the electrostatic chuck provides greater surface area and stronger chucking force in the inner band and outer band, thereby reducing gas leakage from the inner channel and/or outer channel.

In some embodiments, a surface roughness of one or more of the plurality of substrate support mesas 115, the inner band 130 or the outer band 150 is reduced relative to a standard electrostatic chuck. In some embodiments, the surface roughness is reduced by soft polishing one or more of the plurality of substrate support mesas 115, the inner band 130 or the outer band 150. In some embodiments, surface roughness of the outer band is reduced by an amount in a range of about 70% to about 90% relative to a standard electrostatic chuck.

For example, a standard electrostatic chuck may have a surface roughness in a range of about 25 Ra to about 40 Ra. In some embodiments, the surface roughness of the outer band is reduced to less than or equal to about 25 Ra, less than or equal to about 20 Ra, less than or equal to about 15 Ra, less than or equal to about 10 Ra or less than or equal to about 7 Ra. In some embodiments, the surface roughness is reduced to about 6 Ra. In some embodiments, the surface roughness is in a range of about 10 Ra to about 25 Ra or about 15 Ra to about 20 Ra. In some embodiments, surface roughness is measured by surface profilometer.

Another embodiment of the disclosure provides for an electrostatic chuck with reduced substrate support mesas. In some embodiments, the number of substrate support mesas is reduced. In some embodiments, the contact area of the substrate support mesas is reduced. In some embodiments, the percentage of the central region covered by the substrate support mesas is reduced. In some embodiments, the ratio between perimeter and area of each substrate support mesa is reduced.

Without being bound by theory it is believed that each of the modifications proposed above reduces the conductive heat transfer through the substrate support mesas. While convective heat transfer will still occur, a relatively greater amount of heat transfer is expected to occur through the inner band and outer band where it can be more easily controlled using the inner channel and outer channel.

For example, a standard electrostatic chuck may have a square substrate support mesa where each mesa has a contact area of greater than or equal to about 11 mm$^2$. The number of mesas on a standard electrostatic chuck may result in contact coverage for greater than or equal to about 12% or greater than or equal to about 15% of the total area of the top surface of the electrostatic chuck.

In some embodiments, the substrate support mesas are circular in shape. In some embodiments, each mesa has a contact area of less than or equal to about 10 mm$^2$. In some embodiments, the number of mesas results in contact coverage for less than or equal to about 10%, less than or equal to about 7% or less than or equal to about 5% of the total area of the electrostatic chuck.

Further embodiments of the disclosure provide for an electrostatic chuck with a wider inner band and/or outer band. Without being bound by theory, it is believed that the wider inner band and/or outer band provide for increased heat transfer between the electrostatic chuck and the wafer. It is also believed that a wider outer band may assist in preventing leakage of cooling gas from the outer channel. Further, it is believed that a wider inner band may allow for greater pressure variations between the inner channel and the outer channel.

Additional embodiments of the disclosure provide for an electrostatic chuck with increased pressure in the outer channel and/or decreased pressure in the inner channel. Without being bound by theory, it is believed that an increased pressure differential between the outer channel and the inner channel provides greater control over the temperature uniformity of the wafer. It is also believed that the physical modifications to a standard electrostatic chuck outlined in this disclosure allow for a greater pressure differential.

In some embodiments, the maximum pressure of coolant within the inner channel and the outer channel is about 20

Torr. In some embodiments, the minimum pressure within the inner channel and the outer channel is about 2 Torr.

In some embodiments, a pressure within the inner channel (IC pressure) is less than a pressure within the outer channel (OC pressure). In some embodiments, the IC pressure is less than or equal to about 6 Torr, less than or equal to about 5.5 Torr, or less than or equal to about 5 Torr. In some embodiments, the OC pressure is greater than or equal to about 14 Torr, greater than or equal to about 15 Torr, greater than or equal to about 17 Torr, or greater than or equal to about 19 Torr.

In some embodiments, the difference between the IC pressure and the OC pressure greater than or equal to about 8 Torr, greater than or equal to about 10 Torr, greater than or equal to about 12 Torr or greater than or equal to about 14 Torr. In some embodiments, the ratio of the OC pressure to the IC pressure is greater than or equal to about 2.5, greater than or equal to about 3, or greater than or equal to about 4. In some embodiments, the ratio of the OC pressure to the IC pressure is in a range of about 2.5 to about 4, in a range of about 3 to about 4 or in a range of about 3.5 to about 4.

Without being bound by theory, the various embodiments of the disclosure improve control of the temperature of a wafer across the wafer (temperature uniformity). It is believed that temperature correlates with the concentration of hydrogen (H %) in films produced by a high-density plasma (HDP) deposition process. The increased H % also correlates to the wet etch rate (WER) and wet etch rate ratio (WERR) of the deposited films.

Provided that the improved temperature control of some embodiments allows for increased temperature uniformity across the surface of a wafer during an HDP process, some embodiments of the disclosure also provide for increased H % uniformity and increased WERR uniformity across the wafer. In some embodiments, the electrostatic chuck is configured to have a H % with a range (R/2) of less than or equal to about 2%, less than or equal to about 1% or less than or equal to about 0.5% across a wafer.

EXAMPLES

Five electrostatic chuck samples of approximately 300 mm in diameter were prepared with varying dimensions and properties as displayed in Table 1. Unless specified otherwise, all dimensions are normalized to Sample 1.

TABLE 1

| Sample | Surface Roughness | Normalized $W_{OB}$ | Mesa Shape | Normalized Mesa Coverage | Normalized $W_{IB}$ |
|---|---|---|---|---|---|
| 1 | 35 Ra | 1.0 | Square | 1.00 | 1.0 |
| 2 | 6 Ra | 1.0 | Square | 1.00 | 1.0 |
| 3 | 6 Ra | 1.7 | Round | 0.28 | 1.0 |
| 4 | 15-20 Ra | 1.7 | Square | 1.00 | 1.6 |
| 5 | 15-20 Ra | 2.3 | Square | 1.00 | 1.0 |

An evaluation of the average temperature of a wafer during processing was performed at various set points for the IC pressure and OC pressure for Samples 1-4. Temperature was measured by an infrared optical thermometer with a wavelength of about 1 μm. Temperature was measured on the backside of the wafer through a small hole within the central region of the electrostatic chuck. The thermometer was unable to measure temperatures below 193° C. Temperatures of 193° C. (or lower) are presented in Tables 2A-2D as "LOW".

The data is grouped by IC pressure in Tables 2A-2D. In some instances, higher OC pressures could not be maintained due to leakage. These conditions are marked with dashes.

TABLE 2A

IC PRESSURE = 2 TORR

| | OC Pressure | | | | | |
|---|---|---|---|---|---|---|
| Sample | 7 | 9 | 11 | 13 | 15 | 17 |
| 1 | 479 | 470 | 456 | 436 | — | — |
| 2 | 478 | 477 | 461 | 442 | — | — |
| 3 | 467 | 465 | 456 | 436 | 421 | — |
| 4 | 473 | 472 | 466 | 442 | 417 | 391 |

TABLE 2B

IC PRESSURE = 4 TORR

| | OC Pressure | | | | | |
|---|---|---|---|---|---|---|
| Sample | 7 | 9 | 11 | 13 | 15 | 17 |
| 1 | 367 | 367 | 367 | 366 | — | — |
| 2 | 375 | 372 | 381 | 382 | — | — |
| 3 | 353 | 328 | 352 | 351 | 351 | — |
| 4 | 348 | 349 | 353 | 532 | 347 | 336 |

TABLE 2C

IC PRESSURE = 6 TORR

| | OC Pressure | | | | | |
|---|---|---|---|---|---|---|
| Sample | 7 | 9 | 11 | 13 | 15 | 17 |
| 1 | 297 | 296 | 295 | 294 | — | — |
| 2 | 313 | 313 | 313 | 311 | — | — |
| 3 | 279 | 279 | 278 | 278 | 277 | — |
| 4 | 275 | 273 | 275 | 274 | 272 | 271 |

TABLE 2D

IC PRESSURE = 8 TORR

| | OC Pressure | | | | | |
|---|---|---|---|---|---|---|
| Sample | 7 | 9 | 11 | 13 | 15 | 17 |
| 1 | 245 | 245 | 240 | 232 | — | — |
| 2 | 275 | 275 | 275 | 274 | — | — |
| 3 | LOW | LOW | LOW | LOW | LOW | — |
| 4 | LOW | LOW | LOW | LOW | LOW | LOW |

A sample of $SiO_2$ was prepared using a HDP method on each of the electrostatic chuck samples for varying pressures within the inner channel and outer channel. The substrate temperature was set at 315° C., but variations in temperature across the substrate surface were apparent due to the inner channel and outer channel cooling.

The prepared $SiO_2$ films were evaluated for wet etch rate across the surface of the wafer and standardized to form a radial profile for each sample. To evaluate wet etch rate, the oxide film thickness on the surface of the wafer was measured both before and after the wafers were dipped for a controlled time in a 1% HF solution. A summary of the results for samples 1-4 is provided in Table 3. All pressures are provided in Torr. For each combination of IC pressure and OC pressure, the average wet etch rate across the wafer has been standardized to 1. The standard deviation and R/2, listed as 1Sig/R/2, are provided as an indication of the variance of the wet etch rate across the wafer. For samples 1-3, higher OC pressures could not be maintained due to leakage. These conditions are marked with dashes.

TABLE 3

Standard Deviation and Range of Standardized Wet Etch Rate

| Sample | IC Pressure | OC Pressure | | | | | |
|---|---|---|---|---|---|---|---|
| | | 7 | 9 | 11 | 13 | 15 | 17 |
| 1 | 6 | 5.8/7.9 | 3.3/5.0 | 1.4/2.6 | 0.3/1.0 | — | — |
| 2 | 6 | 3.7/4.1 | 1.8/2.0 | 0.8/1.0 | 0.6/0.8 | — | — |
| 3 | 5.6 | 5.7/6.2 | 3.7/4.0 | 1.7/2.1 | 0.8/1.4 | 2.3/3.2 | — |
| 4 | 4.9 | 5.5/7.0 | 2.6/3.4 | 1.0/1.2 | 1.4/1.7 | 3.0/3.7 | 4.6/5.5 |

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. An electrostatic chuck comprising:
a top surface having a total area and a bottom surface, the top surface configured to support a wafer during processing comprising:
a central region comprising a plurality of substrate support mesas extending from a top surface of the central region and having a contact area coverage;
an inner channel (IC) with an IC width surrounding the central region;
an inner band (IB) with an IB width surrounding the inner channel, wherein a depth of the inner channel from a top surface of the central region to a bottom surface of the IC is less than a depth from a top surface of the IB to the bottom surface of the IC;
an outer channel (OC) with an OC width surrounding the inner band, wherein a depth of the outer channel from the top surface of the electrostatic chuck is greater than the depth from the top surface of the central region to the bottom surface of the IC; and
an outer band (OB) with an OB width surrounding the outer channel; and
a controller configured to control temperature across the wafer secured to the top surface of the electrostatic chuck during processing.

2. The electrostatic chuck of claim 1, wherein a maximum pressure of coolant within the IC and the OC is 20 Torr.

3. The electrostatic chuck of claim 1, wherein a pressure within the inner channel (IC pressure) is less than pressure within the outer channel (OC pressure).

4. The electrostatic chuck of claim 3, wherein a difference between the IC pressure and the OC pressure is greater than or equal to 8 Torr.

5. The electrostatic chuck of claim 4, wherein the OC pressure is greater than or equal to 14 Torr.

6. The electrostatic chuck of claim 5, wherein a ratio of the OC pressure to the IC pressure is in a range of 2.33 to 4.

7. The electrostatic chuck of claim 6,
wherein the electrostatic chuck is configured to tune a concentration of hydrogen (H %) across a surface of the wafer secured to the electrostatic chuck during processing with a range of variability R/2 of less than or equal to 2%.

8. The electrostatic chuck of claim 7, wherein the R/2 is less than or equal to 0.5% across the surface of the wafer.

9. The electrostatic chuck of claim 7, wherein the plurality of substrate support mesas are circular in shape.

10. The electrostatic chuck of claim 9, wherein an area of the plurality of substrate support mesas comprises less than 10% of a total area of the top surface.

11. The electrostatic chuck of claim 7, wherein the contact area coverage of the plurality of substrate support mesas is less than 5% of the total area of the top surface of the electrostatic chuck.

12. The electrostatic chuck of claim 7, wherein the OB width is in a range of 3.5 mm to 4 mm.

13. The electrostatic chuck of claim 1, wherein the contact area coverage of the plurality of substrate support mesas is less than or equal to 10% of the total area of the top surface of the electrostatic chuck.

14. The electrostatic chuck of claim 13, wherein the contact area coverage of the plurality of substrate support mesas is less than 7% of the total area of the top surface of the electrostatic chuck.

15. The electrostatic chuck of claim 1, wherein the OC width is in a range of 2 mm to 6 mm.

* * * * *

UNITED STATES PATENT AND TRADEMARK OFFICE
CERTIFICATE OF CORRECTION

PATENT NO. : 12,322,633 B2
APPLICATION NO. : 17/368134
DATED : June 3, 2025
INVENTOR(S) : Panavalappil Kumarankutty et al.

Page 1 of 1

It is certified that error appears in the above-identified patent and that said Letters Patent is hereby corrected as shown below:

On the Title Page

•Column 2, Line 26, add "Machine" before "Translation of JP2013153171".

In the Specification

•Column 3, Line 39, replace "value+/-a" after "as the average" with "value +/- a".

•Column 11, Line 3, replace "1Sig/R/2" after "listed as" and before "are provided" with "1Sig / R/2".

Signed and Sealed this
Nineteenth Day of August, 2025

Coke Morgan Stewart
*Acting Director of the United States Patent and Trademark Office*